United States Patent
Shin

(10) Patent No.: US 12,317,546 B2
(45) Date of Patent: May 27, 2025

(54) SPLIT GATE POWER MOSFET AND SPLIT GATE POWER MOSFET MANUFACTURING METHOD

(71) Applicant: SK keyfoundry Inc., Cheongju-si (KR)

(72) Inventor: Hyunkwang Shin, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 0 days.

(21) Appl. No.: 18/515,015

(22) Filed: Nov. 20, 2023

(65) Prior Publication Data

US 2024/0088247 A1 Mar. 14, 2024

Related U.S. Application Data

(62) Division of application No. 17/528,300, filed on Nov. 17, 2021, now Pat. No. 11,862,695.

(30) Foreign Application Priority Data

May 31, 2021 (KR) .......................... 10-2021-0069855

(51) Int. Cl.
| | | |
|---|---|---|
| H01L 29/423 | (2006.01) | |
| H10D 30/01 | (2025.01) | |
| H10D 30/66 | (2025.01) | |
| H10D 30/68 | (2025.01) | |
| H10D 64/00 | (2025.01) | |

(52) U.S. Cl.
CPC ..... *H10D 30/6894* (2025.01); *H10D 30/0297* (2025.01); *H10D 30/0411* (2025.01);
(Continued)

(58) Field of Classification Search
CPC ......... H01L 29/42336; H01L 29/66734; H01L 29/66825; H01L 29/7813; H01L 29/788;
(Continued)

(56) References Cited

U.S. PATENT DOCUMENTS

| 7,385,248 B2 | 6/2008 | Herrick et al. |
| 7,459,751 B2 | 12/2008 | Sugiyama |

(Continued)

FOREIGN PATENT DOCUMENTS

| JP | 2011-258834 A | 12/2011 |
| JP | 2019-140152 A | 8/2019 |

OTHER PUBLICATIONS

Korean Office Action issued on Aug. 25, 2022, in counterpart Korean Patent Application No. 10-2021-0069855 (13 pages in Korean).

*Primary Examiner* — Shahed Ahmed
(74) *Attorney, Agent, or Firm* — NSIP Law

(57) ABSTRACT

A split gate MOSFET is provided. The split gate MOSFET may have a low capacitance between a gate electrode and a source electrode. The trench MOSFET includes a substrate; a gate trench formed on the substrate; a sidewall insulating layer formed on a sidewall of the gate trench; a source electrode surrounded by the sidewall insulating layer; a first upper electrode provided above the source electrode; a first inter-electrode insulating layer formed between the source electrode and the first upper electrode; a second upper electrode formed adjacent to a side of the first upper electrode and surrounding the first upper electrode; and an interlayer insulating layer formed on the first upper electrode and the second upper electrode.

18 Claims, 16 Drawing Sheets

(52) U.S. Cl.
CPC ........... *H10D 30/668* (2025.01); *H10D 30/68* (2025.01); *H10D 64/117* (2025.01)

(58) Field of Classification Search
CPC ......... H01L 29/41766; H01L 29/42376; H01L 29/66727; H01L 29/4236; H01L 29/66613–66628; H01L 29/7825; H01L 29/42352; H01L 29/402–407; H01L 29/7833–7836; H10D 30/6894; H10D 30/0297; H10D 30/0411; H10D 30/668; H10D 30/68; H10D 64/117; H10D 30/0245; H10D 30/635; H10D 64/62
See application file for complete search history.

(56) References Cited

U.S. PATENT DOCUMENTS

| | | | |
|---|---|---|---|
| 7,679,136 B2 | 3/2010 | Kachi et al. | |
| 7,859,047 B2 | 12/2010 | Kraft et al. | |
| 8,067,800 B2 | 11/2011 | Hsieh | |
| 8,373,225 B2 | 2/2013 | Hsieh | |
| 8,587,054 B2 | 11/2013 | Hsieh | |
| 8,742,401 B2 | 6/2014 | Yilmaz et al. | |
| 8,975,662 B2 | 3/2015 | Hutzler et al. | |
| 9,391,194 B1 | 7/2016 | Fukunaga | |
| 9,825,137 B2 | 11/2017 | Kim | |
| 9,882,043 B2 | 1/2018 | Kim et al. | |
| 10,304,933 B1 | 5/2019 | Woo et al. | |
| 10,825,909 B2 | 11/2020 | Ohtani | |
| 10,910,478 B1 * | 2/2021 | Xu | H01L 29/0878 |
| 2006/0281249 A1 | 12/2006 | Yilmaz et al. | |
| 2010/0123187 A1 * | 5/2010 | Burke | H01L 29/407 |
| | | | 257/330 |
| 2011/0303925 A1 | 12/2011 | Nishimura | |
| 2013/0062688 A1 * | 3/2013 | Kobayashi | H01L 29/0878 |
| | | | 257/330 |
| 2019/0259873 A1 * | 8/2019 | Yamanobe | H01L 29/66734 |
| 2020/0328302 A1 * | 10/2020 | Lin | H01L 29/7813 |

* cited by examiner

SPLIT GATE POWER MOSFET AND SPLIT GATE POWER MOSFET MANUFACTURING METHOD

CROSS-REFERENCE TO RELATED APPLICATION(S)

This application is a division of application Ser. No. 17/528,300 filed on Nov. 17, 2021, which claims the benefit under 35 U.S.C. § 119 of Korean Patent Application No. 10-2021-0069855, filed on May 31, 2021, in the Korean Intellectual Property Office, the entire disclosure of which is incorporated herein by reference for all purposes.

BACKGROUND

1. Field

The present disclosure relates to a split gate power MOSFET, and a split gate power MOSFET manufacturing method.

2. Description of Related Art

A high-efficiency and high-performance power metal-oxide semiconductor field-effect transistor (MOSFET) may be implemented in power electronic applications in order to achieve energy conservation and device miniaturization.

For the high-efficiency and high-performance power MOSFET, power loss must be minimized. In order to reduce power loss, device switching loss and device conduction loss must be reduced. The device conduction loss may be determined by an ON-resistance when the power MOSFET is conducted by applying a voltage to a gate of the power MOSFET, and the device switching loss may be determined by the gate charge Qg. Therefore, in order to reduce the switching loss of the power MOSFET, it is beneficial to have a structure that reduces the charge of the gate region, that is, a structure that minimizes the capacitance of the device.

A trench power MOSFET, which is a type of power MOSFET, has recently been implemented since the trench power MOSFET may have a high breakdown voltage and a low drain-source resistance Rds.

However, a split gate trench power MOSFET structure may have a problem that there is a high capacitance between a gate electrode and a source electrode. Additionally, the manufacturing process of the split gate trench power MOSFET is difficult because there is a big difference in the thickness of the insulating layer and a separate additional process may be necessary.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a trench metal-oxide semiconductor field-effect transistor (MOSFET) manufacturing method includes forming a gate trench in a substrate; forming a sidewall insulating layer within the gate trench; forming a source electrode in a lower region of the gate trench by depositing a first conductive layer on the sidewall insulating layer and etching the first conductive layer; forming a first inter-electrode insulating layer over the source electrode; forming a first upper electrode by depositing a second conductive layer on the first inter-electrode insulating layer and etching the second conductive layer; removing a portion of sidewall insulating layer to expose a sidewall of the gate trench; forming a gate insulating layer between the sidewall of the gate trench and the first upper electrode; and forming, by depositing a third conductive layer on the gate insulating layer and etching the third conductive layer, a second upper electrode adjacent to the first upper electrode.

The second upper electrode may be formed to be parallel to a side of the first upper electrode.

The method may include forming a body region on the substrate, and forming a source region on the body region; forming an interlayer insulating layer on the source region and on the gate trench; and forming a source metal on the interlayer insulating layer.

The removing of the portion of the sidewall insulating layer may include removing the portion of the sidewall insulating layer such that a first portion of the sidewall of the gate trench and a first portion of a side of the first upper electrode are exposed, and a second portion of the side of the first upper electrode is surrounded by the sidewall insulating layer.

A width of the first upper electrode may be less than a width of the second upper electrode, and a depth of the first upper electrode from a surface of the substrate may be greater than a depth of the second upper electrode from the surface of the substrate.

The first upper electrode may include a first region and a second region, the first region may be formed to overlap the second upper electrode in a horizontal direction, the second region may be formed under the first region, and is formed closer to the source electrode than the first region, and a width of the second region is greater than a width of the first region.

The method may include forming a second inter-electrode insulating layer on a surface of the first upper electrode, and a thickness of the second inter-electrode insulating layer may be greater than a thickness of the gate insulating layer.

In a general aspect, a trench metal-oxide semiconductor field-effect transistor (MOSFET) includes a substrate; a gate trench formed on the substrate; a sidewall insulating layer formed on a sidewall of the gate trench; a source electrode, surrounded by the sidewall insulating layer; a first upper electrode, provided above the source electrode; a first inter-electrode insulating layer, formed between the source electrode and the first upper electrode; second upper electrodes, formed adjacent to sides of the first upper electrode, and configured to surround the first upper electrode; and an interlayer insulating layer, formed on the first upper electrode and the second upper electrodes.

The trench MOSFET may include a body region, formed on the substrate; a high concentration source region and a high concentration contact region formed in the body region; and a source metal, provided on the interlayer insulating layer and configured to be in contact with the body region.

The first upper electrode may be configured to be electrically connected to the second upper electrodes and is configured to be implemented as a gate electrode.

The trench MOSFET may include a gate insulating layer formed on an upper sidewall of the gate trench, wherein the sidewall insulating layer, the first inter-electrode insulating layer, the gate insulating layer, and the interlayer insulating layer are configured to be connected to each other.

A width of the first upper electrode may be less than a width of the second upper electrode, and a depth of the first upper electrode from a surface of the substrate may be greater than a depth of the second upper electrode from the surface of the substrate.

The first upper electrode may include a first region and a second region, the first region is formed to overlap the second upper electrodes in a horizontal direction, the second region is formed under the first region, and is formed closer to the source electrode than the first region, and a width of the second region is greater than a width of the first region.

In a general aspect, a trench metal-oxide semiconductor field-effect transistor (MOSFET) includes a substrate; a body region, formed on the substrate; a source region, disposed in the body region; a gate trench, formed on the substrate; a lower electrode, formed in a lower region of the gate trench; a plurality of upper electrodes, formed above the lower electrode, wherein the plurality of upper electrodes comprise: a first upper electrode, formed to overlap the lower electrode; and second upper electrodes, configured to surround the first upper electrode; a first inter-electrode insulating layer, formed between the lower electrode and the first upper electrode; a gate insulating layer, formed on a sidewall of the gate trench; an interlayer insulating layer, formed on the plurality of upper electrodes; and a source metal, provided on the interlayer insulating layer, and configured to be in contact with the body region.

The first upper electrode and the second upper electrode may be configured to be implemented as a gate electrode.

A width of the first upper electrode may be less than a width of the second upper electrode, and a depth of the first upper electrode from a surface of the substrate is greater than a depth of the second upper electrode from the surface of the substrate.

The first upper electrode may include a first region and a second region, the first region may be formed to overlap the second upper electrode in a horizontal direction, the second region may be formed under the first region, and may be formed closer to the lower electrode than the first region, and a width of the second region may be greater than a width of the first region.

A cross-sectional area of the second upper electrode may be greater than a cross-sectional area of the first upper electrode.

The trench MOSFET may include a sidewall insulating layer configured to surround the lower electrode, and a width of the sidewall insulating layer may be larger than a width of the lower electrode.

A depth of the first upper electrode from a surface of the substrate may be greater than a depth of the body region from the surface of the substrate.

The trench MOSFET may include a second inter-electrode insulating layer, formed between the first upper electrode and the second upper electrode, and a thickness of the second inter-electrode insulating layer may be greater than a thickness of the gate insulating layer.

The first upper electrode may include a first region and a second region, the first region may be formed to overlap the second upper electrode in a horizontal direction, the second region is formed under the first region, and is formed closer to the lower electrode than the first region, and a width of the first region of the first upper electrode is less than a width of the lower electrode.

In a general aspect, a trench metal-oxide semiconductor field-effect transistor (MOSFET) includes a substrate; a gate trench formed in the substrate; a source electrode formed in a lower region of the gate trench; and a plurality of gate electrodes disposed in an upper region of the gate trench; wherein the plurality of gate electrodes comprise: a pair of gate electrodes formed at opposite sides of the upper region of the gate trench, and a floating gate formed between the pair of gate electrodes, and directly above the source electrode, wherein the floating gate comprises a first region and a second region, and wherein a width of the first region is less than a width of the second region.

The trench MOSFET may further include a first inter-electrode insulating layer formed between the source electrode and the floating gate.

A width of the first region may be less than a width of the source electrode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
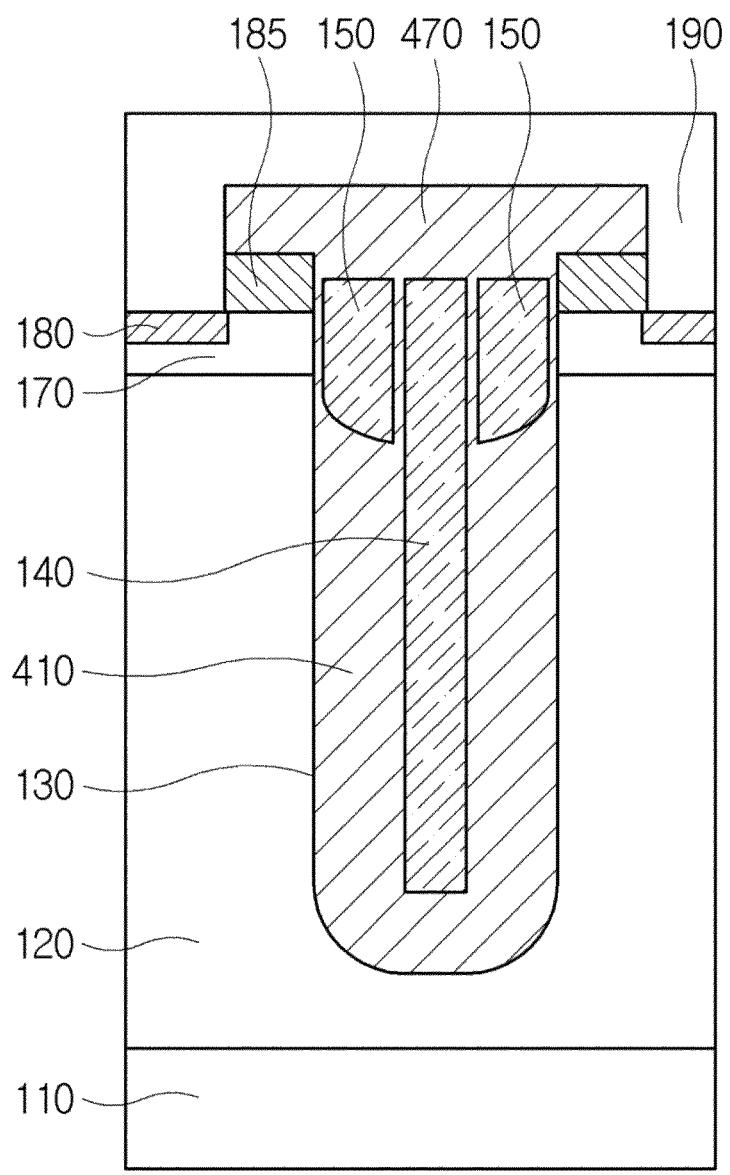
FIGS. 1A and 1B illustrate example structures of an example split gate trench power MOSFET to be compared, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The identification codes (e.g., a, b, c, etc.) in each operation are used for convenience of description and do not describe the order of each operation. Unless specific orders are explicitly specified by the context, each operation may be performed in a different order from the specified order. That is, each operation may be performed in the same order as the specified order, may be performed substantially at the same time, or may be performed in a reverse order to the specified order.

Additionally, the terms "first type" and "second type" may refer to opposite conductive types such as P-type or N-type. Each of the embodiments described and shown herein may include a complementary embodiment thereof. The examples described below will be described by exemplifying examples in which the first type is a P-type and the second type is an N-type.

Unless otherwise defined, all terms used herein have the same meaning as commonly understood by one of ordinary skill in the art to which the examples belong. Commonly used terms defined in the dictionary are to be construed to have exactly the same meaning as that of related technology in the context. As long as terms are not clearly defined in the examples, the terms should not be ideally or excessively construed as formal meaning.

Hereinafter, various embodiments will be described in detail with reference to the accompanying drawings.

Figure 1B:
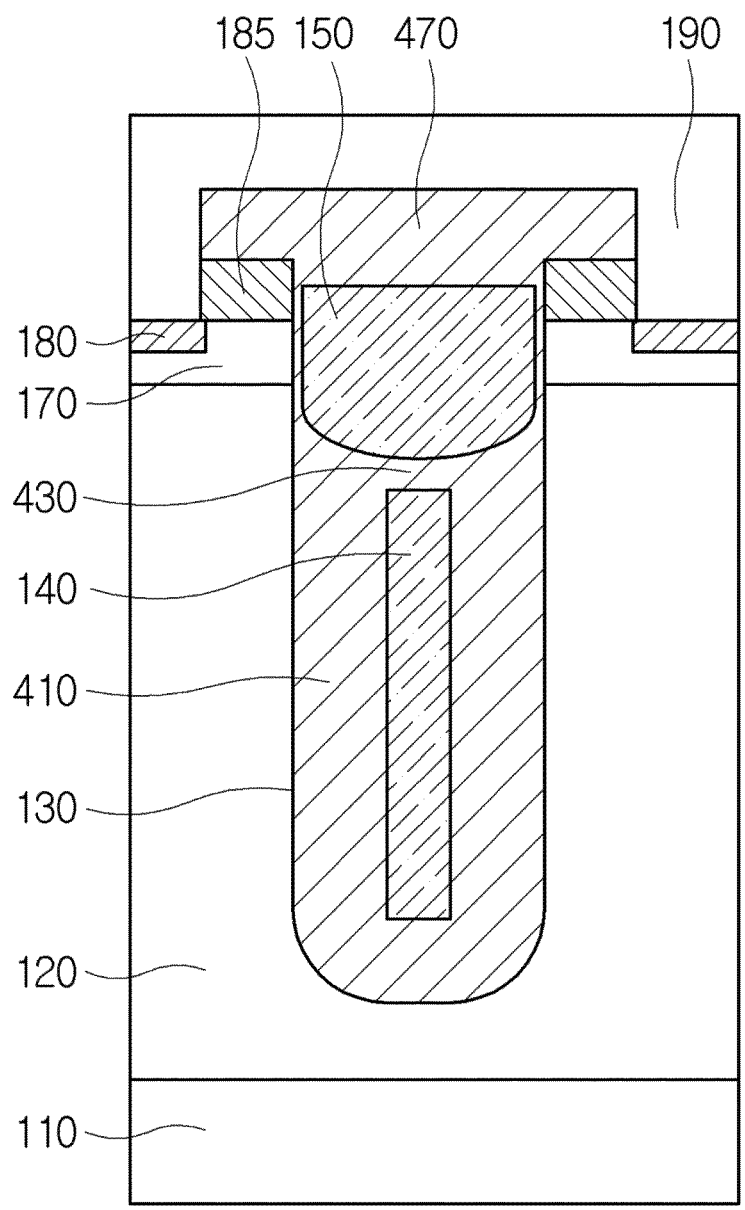

FIGS. 1A and 1B illustrate examples of structures of a trench power MOSFET which are to be compared, and in particular, a structure of an example split gate trench power metal-oxide semiconductor field-effect transistor (MOSFET).

In an example, the split gate power MOSFET may have a low capacitance between a gate electrode and a source electrode.

One or more examples provide a split gate trench power MOSFET structure which has a low capacitance between a gate electrode and a source electrode, obtains uniformity of the thickness of an insulating layer formed on the source electrode, and can be manufactured by an easy manufacturing process.

In one or more examples, the efficiency of a power semiconductor device may be increased by reducing a capacitance between the gate electrode and the source electrode based on the example structure.

In one or more examples, the difference in characteristics according to the example process may be minimized by obtaining uniformity of the thickness of the insulating layer formed on the source electrode based on the example manufacturing process.

The first structure of the split gate trench power MOSFET shown in FIG. 1A may have a long middle source electrode 140 and gate electrodes 150 on both sides of the source electrode 140. The first structure, as illustrated in FIG. 1A may be formed by implementing an easy manufacturing process and may have a problem of a high capacitance between the gate electrode 150 and the source electrode 140.

The second structure of the split gate trench power MOSFET illustrated in FIG. 1B may have a source electrode 140 within the structure, and a gate electrode 150 positioned above the source electrode 140. The structure illustrated in FIG. 1B may have an advantage of having a low capacitance between the source electrode 140 and the gate electrode 150. However, it may be difficult to control and maintain a thickness of a first inter-electrode insulating layer 430 disposed between the source electrode 140 and the gate electrode 150.

Figure 2A:
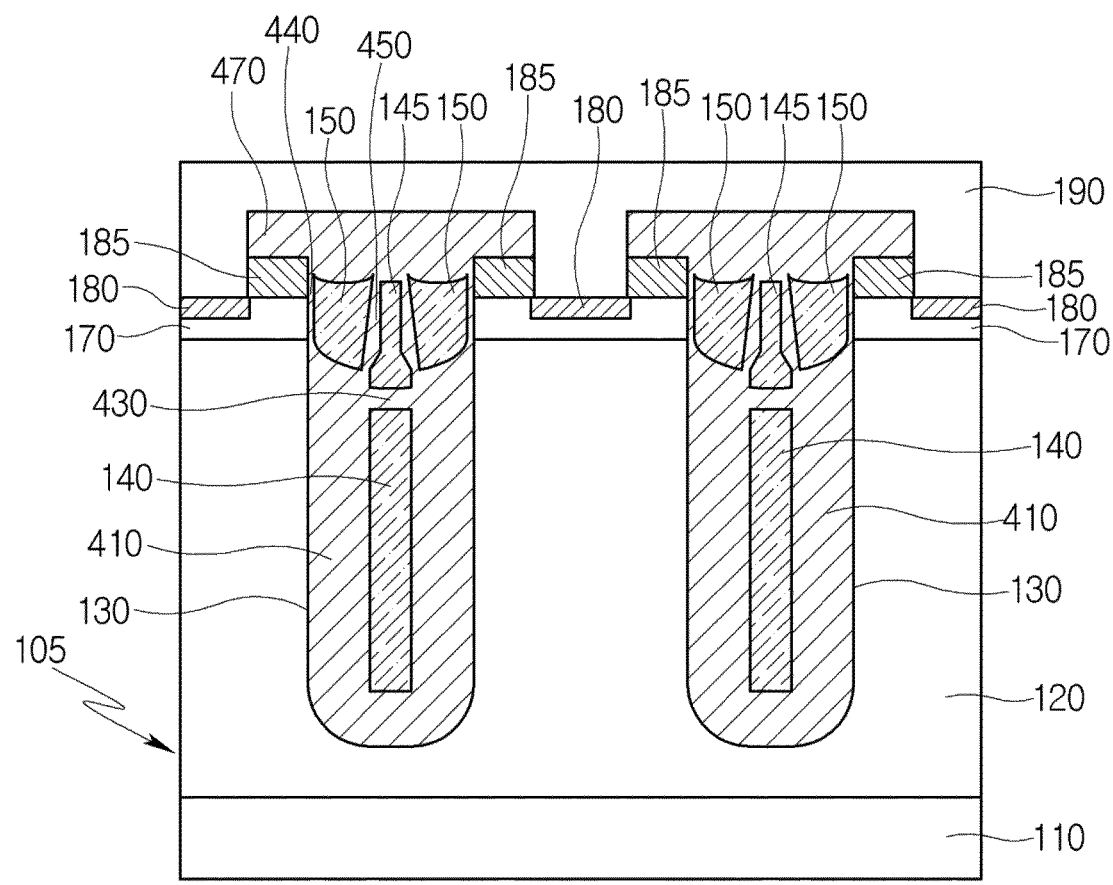
FIGS. 2A and 2B illustrate example structures of an example split gate trench MOSFET, in accordance with one or more embodiments.
Figure 2B:
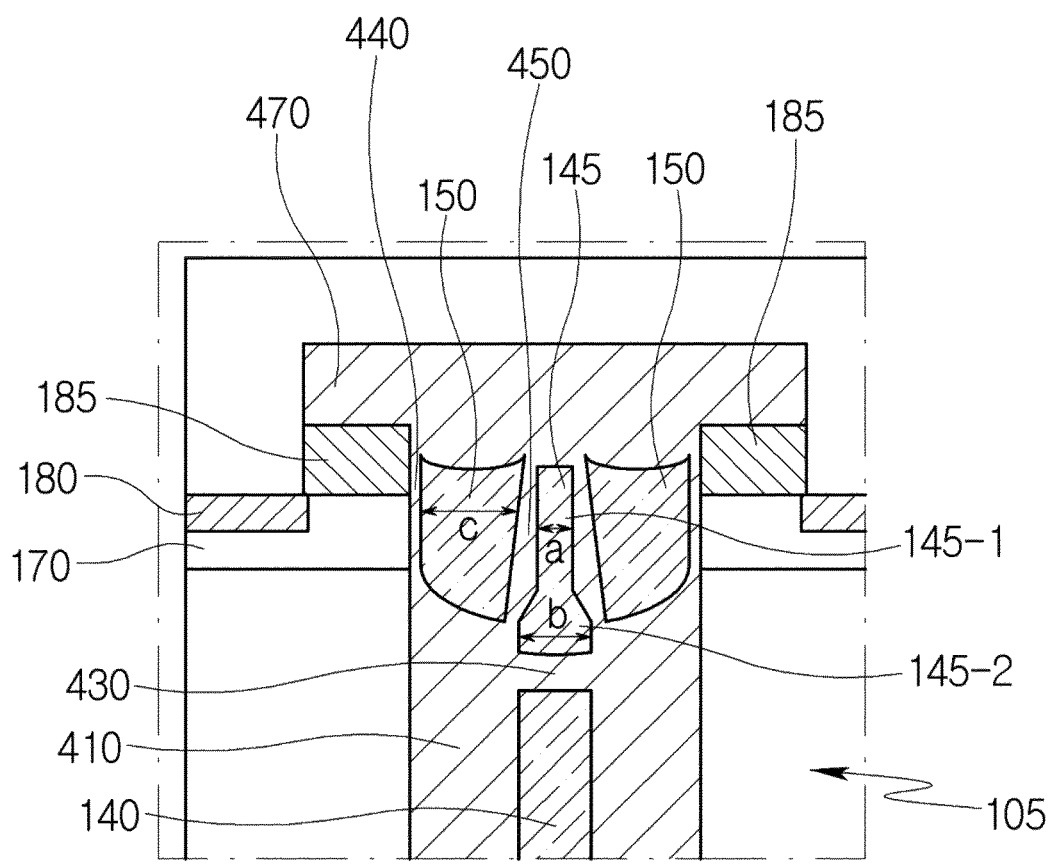

Other annotation numbers besides the source electrode 140 and the gate electrode 150 are explained in the followed FIGS. 2A and 2B.

FIG. 2A illustrates a structure of a split gate trench MOSFET structure, in accordance with one or more embodiments.

While FIG. 2A illustrates a structure of an N-type split gate trench MOSFET, it can be understood that a structure of a P-type split gate trench MOSFET is the same except for a difference in doping.

Referring to FIG. 2A, at least one split gate trench MOSFET includes a high concentration N-type drain region 110 formed in a semiconductor substrate 105, and includes a low concentration N-type epitaxial layer 120 provided on the high concentration N-type drain region 110. In an example, the high concentration N-type drain region 110 may have a higher doping concentration than a doping concentration of the low concentration N-type epitaxial layer 120. The low concentration N-type epitaxial layer 120 can be used as a drift region of the trench MOSFET. Additionally, drain metal may be further provided below the high concentration N-type drain region 110.

In order to form the split gate trench MOSFET, a gate trench 130 may be formed such that it starts from the top surface of the low concentration N-type epitaxial layer 120 and extends to an inner region of the low concentration N-type epitaxial layer 120. In an example, the lower portion of the gate trench 130 may be formed to be spaced apart from the high concentration N-type drain region 110 by a predetermined distance or more.

A sidewall insulating layer 410 and a source electrode 140 may be provided within the gate trench 130. According to the embodiment, the source electrode 140 may be located within the gate trench 130, and the sidewall insulating layer 410 may be provided on both sides of the source electrode 140, and may fill the inside region of the gate trench 130. The width of the sidewall insulating layer 410 may be greater than the width of the source electrode 140. The source electrode 140 may be formed in order to reduce parasitic capacitance between a gate and a drain. The source electrode 140 may be electrically connected to source metal 190. Additionally, since the source metal 190 may be electrically connected to a P-type body region 170, the source electrode 140 may also be electrically connected to the P-type body region 170. In one or more examples, the source electrode 140 may be referred to as a lower electrode, a shield electrode, a field plate electrode, or the like.

In one or more examples, the split gate trench MOSFET includes a gate insulating layer 440 formed on an upper sidewall of the gate trench 130. Each of two gate electrodes (or gate poly) 150 may be formed on the gate insulating layer 440, or may be formed adjacent to the gate insulating layer 440. Floating poly-Si (or floating gate poly) 145 may be formed between the two gate electrodes (or gate poly) 150. The floating poly-Si (or floating gate poly) 145 may also be implemented as a gate electrode. Hereinafter, the two gate electrodes (or gate poly) 150 may be referred to as a second upper electrode. The floating poly-Si (or floating gate poly) 145 may be referred to as a first upper electrode. A plurality of upper electrodes, for example, the floating poly-Si 145 and the two gate electrodes 150, may be formed in an upper inner portion of the gate trench 130. The plurality of upper electrodes 145 and 150 may be divided into a first upper electrode 145 and a second upper electrode 150. The first upper electrode 145 may be formed directly above, and spaced apart from, the source electrode 140. Thus, a first inter-electrode insulating layer 430 may be formed between the source electrode 140 and the first upper electrode 145.

In a non-limiting example, the two second upper electrodes 150 may be formed in a same shape. However, this is only an example, and the two second upper electrodes 150 may be formed in respectively different shapes. In a plan view (not shown), the two second upper electrodes 150 are connected together.

A second inter-electrode insulating layer 450 may also be formed between the first upper electrode 145 and the second upper electrode 150, or the second upper electrodes 150. The second inter-electrode insulating layer 450 may be formed by oxidizing the first upper electrode 145. The second inter-electrode insulating layer 450, which is disposed between the first upper electrode 145 and the second upper electrode 150, may have a thickness that is thicker than a thickness of the gate insulating layer 440 formed on the upper sidewall of the gate trench 130. This is because the first upper electrode 145 made of doped polysilicon may have a more rapid oxidation rate than an oxidation rate of the sidewall of the gate trench 130. The sidewall of the gate trench 130 may be made of single crystal silicon (Si). Since the first upper electrode 145 may use the doped polysilicon, the first upper electrode 145 may have a much higher impurity concentration than an impurity concentration of the single crystal silicon (Si) region, and the second inter-electrode insulating layer 450 may be formed thicker due to the higher impurity concentration, or the like.

FIG. 2B is an enlarged view of the upper portion of FIG. 2A.

Referring to FIG. 2B, there are several characteristics between the first upper electrode 145 and the second upper electrode or electrodes 150.

First, the first upper electrode 145 and the second upper electrode or electrodes 150 may be formed adjacent to each other, and in a non-limiting example, the second upper electrodes 150 may surround the first upper electrodes 145. A width "a" of an upper region of the first upper electrode 145 may be less than a width "c" of an upper portion of the second upper electrodes 150. However, this is only an example. A width of at least one of the second upper electrodes 150 may be different from a width of another of the second upper electrodes 150, and a width "a" of an upper region of the first upper electrode 145 may be equal to or greater than a width "c" of one or more of the second upper electrodes 150. On the basis of a surface of the substrate 105, a depth of the first upper electrode 145 may be greater than a depth of the second upper electrodes 150.

The first upper electrode 145 may include a first region 145-1 and a second region 145-2, and the first region 145-1 may be formed to overlap the second upper electrodes 150 in a horizontal direction. The second region 145-2 may be formed under the first region 145-1, and may be formed to be disposed closer to the lower electrode or source electrode 140 than the first region 145-1. A width "b" of the second region 145-2 may be greater than the width "a" of the first region 145-1. However, this is only an example, and the width "b" may be less than, or equal to, the width "a" of the first region 145-1. The width "a" of the first region 145-1 may be less than a width of the source electrode 140.

The cross-sectional area of the second upper electrodes 150 may be formed to be generally larger than the cross-sectional area of the first upper electrode 145. The depth of the first upper electrode 145 may be formed to be greater than the depth of the P-type body region 170 based on the surface of the substrate 105. On the other hand, the depth of the P-type body region 170 may be less than the depth of the first upper electrode 145, and may be the same as the depth of the second upper electrode 150.

In an example, three electrodes 145 and 150 may be formed. The first upper electrode 145 may also be implemented as a gate electrode or may be floating to be a floating electrode without being connected to any terminal. The second upper electrodes 150 are provided at opposite ends of the upper region of the gate trench 130. Additionally, the gate insulating layer 440 may be provided to surround each of the three electrodes 145 and 150 formed in the upper inner portion of the gate trench 130.

Accordingly, within the gate trench 130, the source electrode 140 may be positioned below the first upper electrode 145. In an example, the first upper electrode 145 may be coupled to both second upper electrodes 150 and may operate as a gate electrode. The source electrode 140, the second upper electrodes 150 and the first upper electrode 145 may be spaced apart from each other by the sidewall insulating layer 410, the first inter-electrode insulating layer 430, the gate insulating layer 440, and the second inter-electrode insulating layer 450. The sidewall insulating layer 410, the first inter-electrode insulating layer 430, the gate insulating layer 440, and the second inter-electrode insulating layer 450 may be connected to each other.

In an example, the source electrode 140, the second upper electrodes 150, and first upper electrode 145 may be formed of doped polysilicon.

The P-type body region 170 may be formed between, or adjacent to, the gate trenches 130 in a region adjacent to the second upper electrodes 150. The P-type body region 170 may become a channel region. A pair of high concentration N-type source regions 185 may be formed in the P-type body region 170. Further, a high concentration P-type region or a body contact region 180 may be formed in the P-type body region 170. The body contact region 180 may be in contact with the source metal 190 and may have higher doping concentration than that of the p-type body region 170. The body contact region 180 may reduce the contact resistance between the P-type body region 170 and the source metal 190.

In an example, drain metal (not shown) may be formed on the bottom surface of the substrate 105. Thus, a current path may be formed in a vertical direction. When electrons are supplied through the source metal 170, the electrons can pass through the N-type source region 185 and the P-type body region 170, pass through the drift region 120, and move to the drain metal through the drain region 110.

An interlayer insulating layer 470 may be formed on the first upper electrode 145 and the second upper electrodes 150, and may be formed on the pair of high concentration N-type source regions 185. The first upper electrode 145 and the second upper electrodes 150 may be electrically isolated from the source metal 170 by the interlayer insulating layer 470. The sidewall insulating layer 410, the first inter-electrode insulating layer 430, the gate insulating layer 440, the second inter-electrode insulating layer 450, and the interlayer insulating layer 470 can be connected to each other.

Compared to a structure in which the source electrode 140 is, as illustrated in FIG. 1A, positioned between the gate electrodes 150, or a structure in which the source electrode is positioned below a large gate electrode 150, as illustrated in FIG. 1B, the split gate trench MOSFET structure illustrated in FIGS. 2A and 2B, in accordance with an example, may have an advantage of reducing capacitance between the gate and the source.

Generally, capacitance between two planar metals increases in proportion to the facing area of the metals, and decreases in inverse proportion to a distance between them. That is, when the distance between two planar metals is large and the facing area is small, the capacitance can be smaller ($C=\varepsilon S/d$).

The following Table 1 below illustrates the results of comparing the structure according to the one or more examples with the structure illustrated in FIGS. 1A and 1B through simulation.

TABLE 1

| Parameters | Disclosed Examples (FIG. 2A) | FIG. 1A | FIG. 1B |
|---|---|---|---|
| Gate Charge Qg | 6.8 nC | 9.0 nC | 7.2 nC |
| Capacitance Qgs between gate and source | 2.2 nC | 3.8 nC | 2.5 nC |
| Capacitance Qgd between gate and drain | 1.2 nC | 0.9 nC | 0.9 nC |

Referring to FIGS. 1A and 1B, it can be seen that, in the example of the MOSFET which has a structure in accordance with one or more examples, a gate charge Qg is similar to a gate charge of FIG. 1B and is reduced to about 75% of FIG. 1A, and the capacitance Qgs between the gate and the source is similar to that of FIG. 1B and is significantly reduced to 58% of FIG. 1A. On the other hand, it can be seen that the capacitance Qgd between the gate and the drain increases by about 30%.

Figure 3:
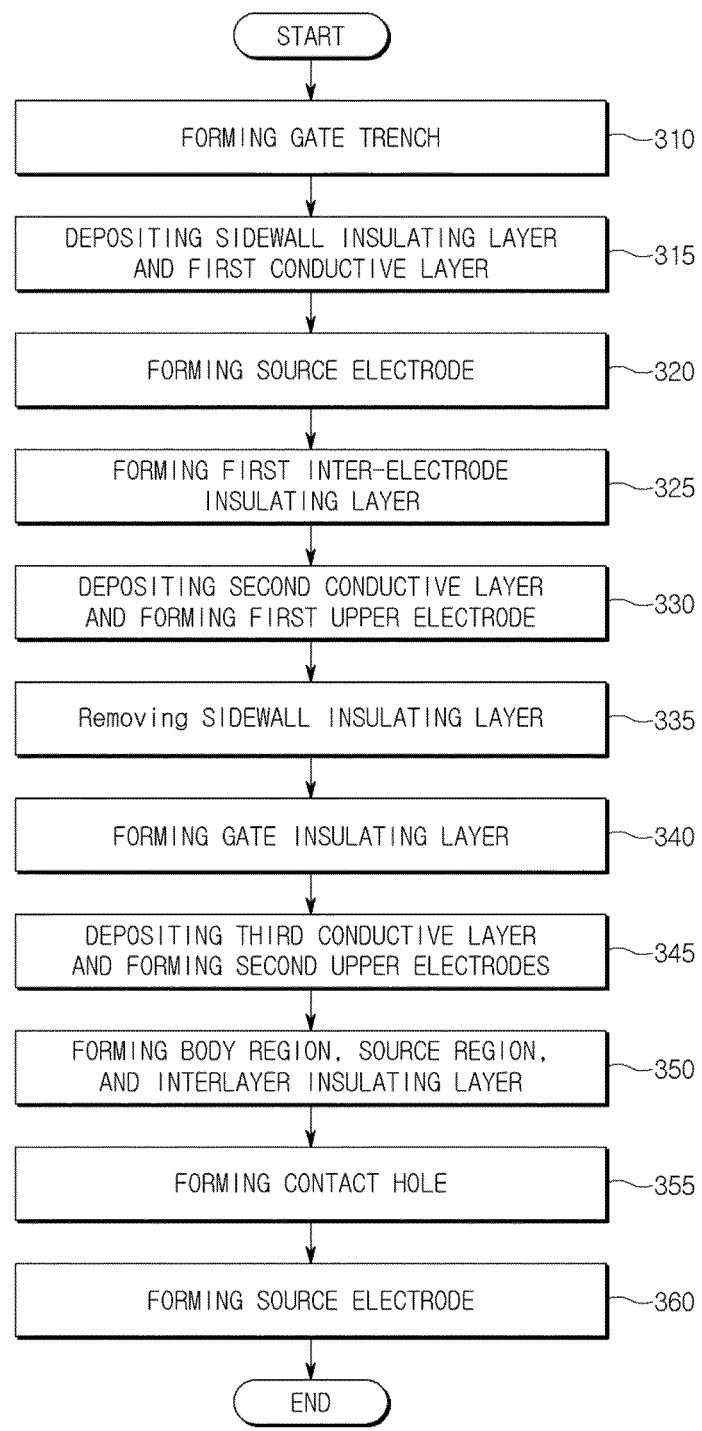
FIG. 3 is a flowchart illustrating an example split gate trench MOSFET manufacturing method, in accordance with one or more embodiments.

FIG. 3 is a flowchart illustrating a method for forming the split gate trench MOSFET structure according to an example. FIGS. 4A to 4K illustrate schematically a shape of the split gate trench MOSFET formed in each operation of a manufacturing process thereof.

Figure 4A:
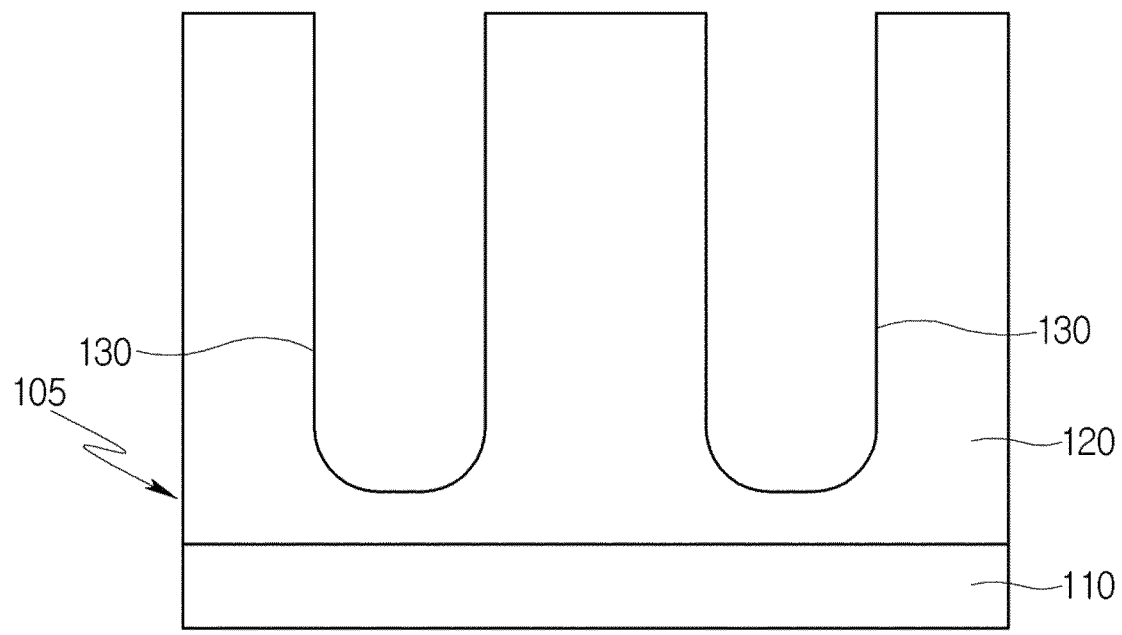
FIGS. 4A to 4K illustrate schematically an example shape of the split gate trench MOSFET formed in each operation of an example manufacturing process, in accordance with one or more embodiments.

Referring to FIGS. 3 and 4A, an operation 310 forms the gate trench in the substrate.

A semiconductor substrate 105 including the high concentration N-type drain region 110 is provided. The low concentration N-type epitaxial layer 120 is formed on the high concentration N-type drain region 110. The low concentration N-type epitaxial layer 120 may be used as a drift region.

According to various examples, the gate trench 130 may be formed in the low concentration N-type epitaxial layer 120 provided on the high concentration N-type drain region 110. According to the example, the gate trench 130 may be formed by masking and etching portions other than a portion where the trench is to be formed on the top surface of the low concentration N-type epitaxial layer 120. The depth of the trench may vary depending on a voltage implemented in the trench MOSFET. In a non-limiting example, the depth of the trench may be 5 um to 20 um, and the width of the trench may be 1 um to 4 um. The voltage implemented in the trench MOSFET may vary from 50 V to 1000V.

Figure 4B:
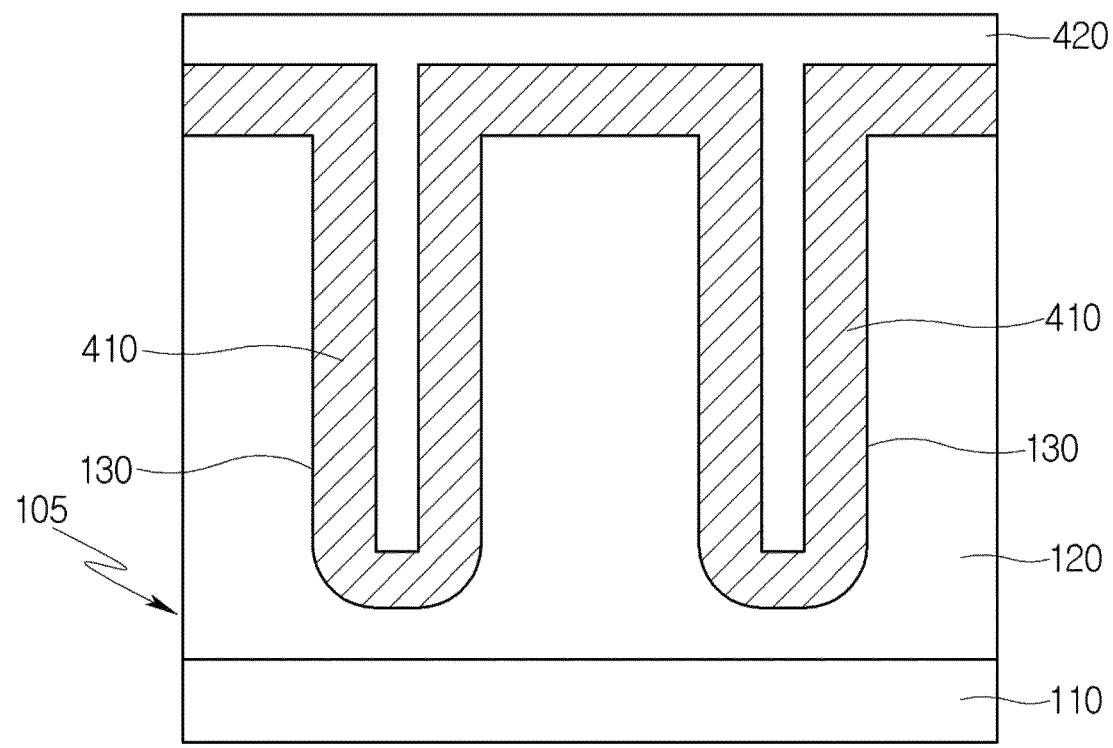

Referring to FIGS. 3 and 4B, an operation 315 forms the sidewall insulating layer 410 within the gate trench 130, and deposits a first conductive layer 420 above the sidewall insulating layer 410.

The sidewall insulating layer 410 may be formed within the gate trench 130, and the first conductive layer 420 may be deposited above and/or between the sidewall insulating layer 410.

In an example, the sidewall insulating layer 410 may be very thick, and may have a thickness of 100 nm to 1000 nm. The sidewall insulating layer 410 is deposited in a U-shape. The sidewall insulating layer 410 may be formed to have a sufficient thickness because the sidewall insulating layer 410 may become a space in which a gate electrode is formed later. In an example, the sidewall insulating layer 410 may be formed by a thermal oxidation method or a Low Pressure Chemical Vapor Deposition (LPCVD) method. Alternatively, first, a thermal oxide layer may be formed by processing the thermal oxidation method and additional deposition may be performed by the LPCVD method, so that the sidewall insulating layer 410 can be formed.

After the sidewall insulating layer 410 is formed, the first conductive layer 420 may be deposited on/or between and the sidewall insulating layer 410. In a non-limiting example, the first conductive layer 420 may be formed of doped polysilicon or a metal layer. Examples of the metal layer include, but are not limited to, W, Ti, Pt, Ta, Al, and Cu.

Figure 4C:
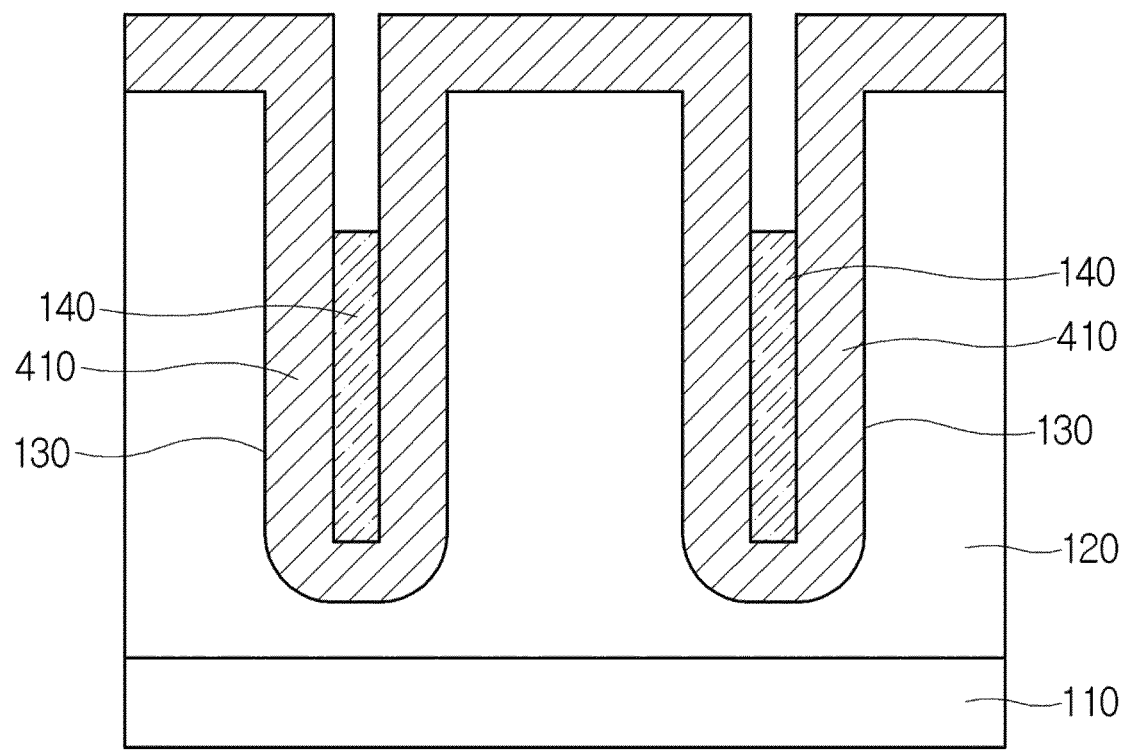

Referring to FIGS. 3 and 4C, an operation 320 forms the source electrode 140 in a lower portion of the gate trench 130.

The first conductive layer 420 deposited on and/or between the sidewall insulating layers 410 is etched to leave only a portion to be used as the source electrode 140 within the gate trench 130

Figure 4D:
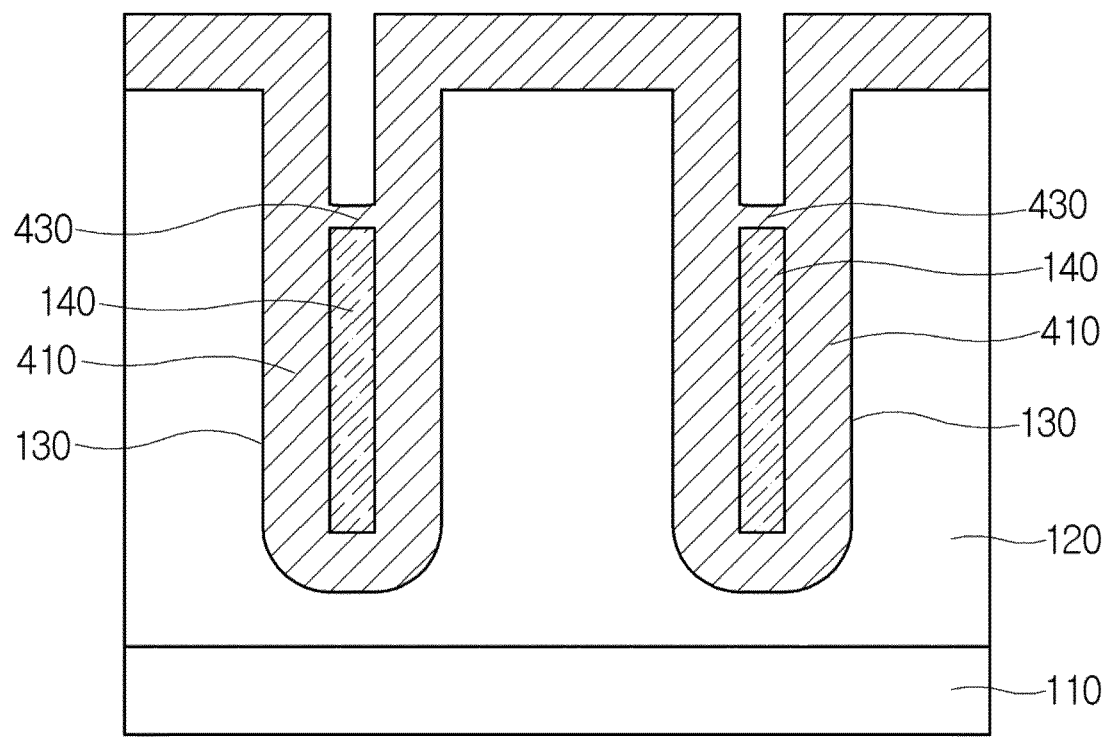

Referring to FIGS. 3 and 4D, an operation 325 forms the inter-electrode insulating layer 430 over the source electrode 140.

Polysilicon implemented as the source electrode 140 may be oxidized to form the first inter-electrode insulating layer 430 over the source electrode 140. The first inter-electrode insulating layer 430 may be referred to as an inter-poly insulating layer, an inter-poly oxide layer, an Inter-electrode oxide layer, or the like.

In an example, the first inter-electrode insulating layer 430 may be formed by thermal oxidation in which a high temperature is applied to a semiconductor device. In an example, since the remaining portion of the gate trench 130, other than the source electrode 140, has been already covered with the insulating layer, additional oxidation does not proceed. However, the first inter-electrode insulating layer 430 can be formed only on the source electrode 140. In an example, the thickness of the first inter-electrode insulating layer 430 may be between 100 nm and 500 nm, and preferably between 200 nm and 300 nm.

Figure 4E:
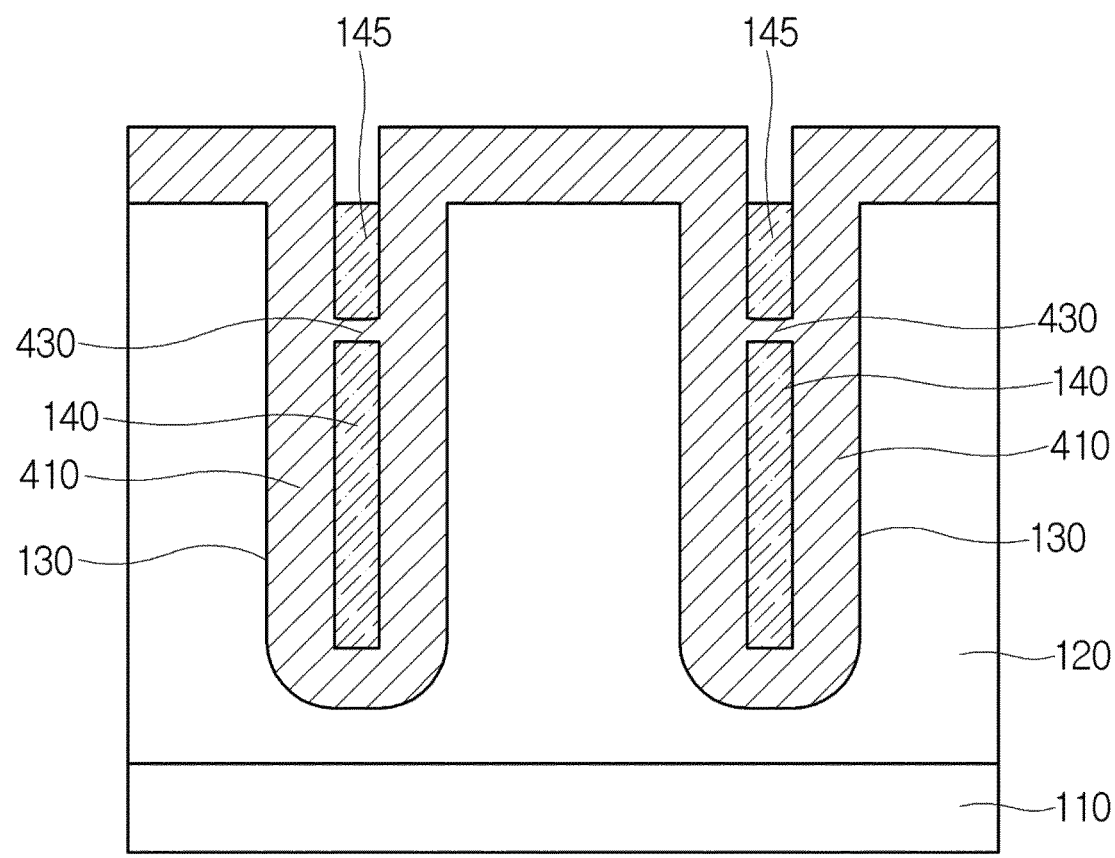

Referring to FIGS. 3 and 4E, an operation 330 forms the first upper electrode 145.

A second conductive layer (not shown) may be deposited on the sidewall insulating layer 410 and etched to form the first upper electrode 145 in the gate trench 130. In an example, the second conductive layer may be formed of doped polysilicon or metal film, similarly to the first conductive layer. Examples of the metal layer include, but are not limited to, W, Ti, Pt, Ta, Al, and Cu. Thus, the first upper electrode 145 may be formed on the first inter-electrode insulating layer 430 over the source electrode 140 within the gate trench 130. The height of the first upper electrode 145 may be almost similar to the height of the surface of the substrate.

Figure 4F:
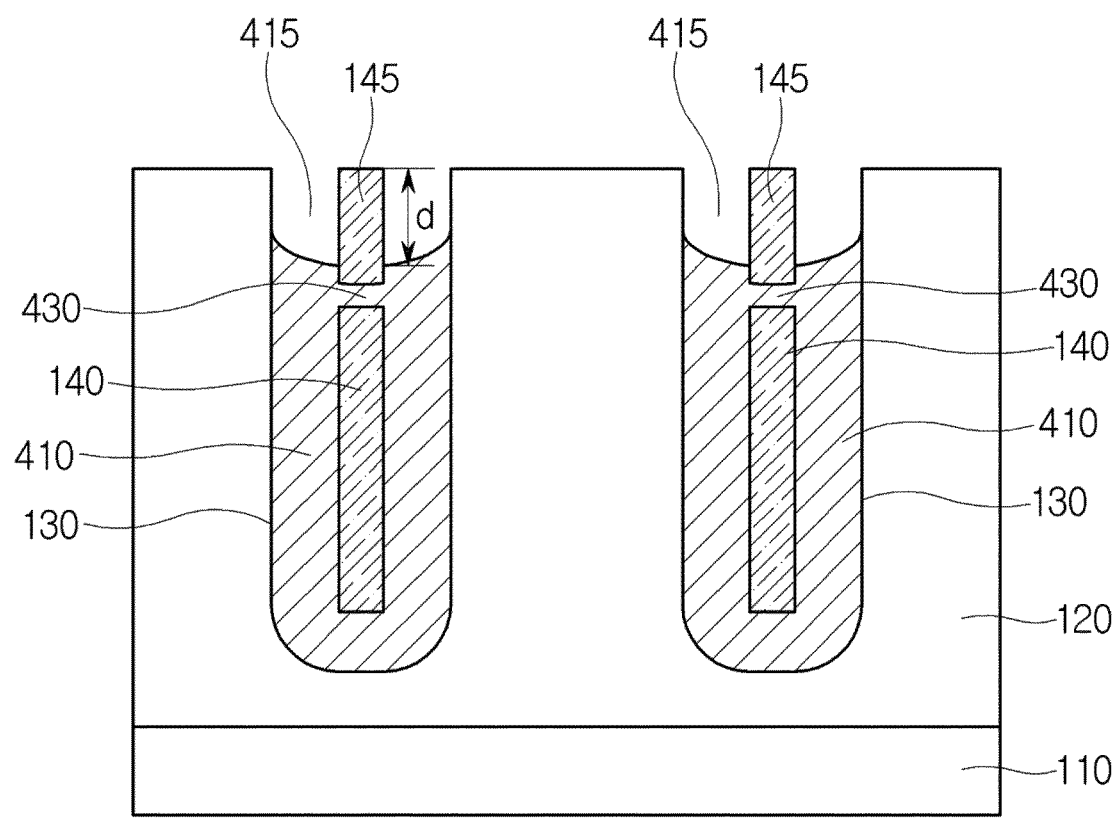

Referring to FIGS. 3 and 4F, an operation 335 removes the sidewall insulating layer such that the sidewall of the gate trench 130 is exposed.

The sidewall insulating layer 410 around the first upper electrode 145 formed within the gate trench 130 may be removed by performing wet etching. Accordingly, the sidewall of the gate trench 130 may be exposed. The wet etching may be a method of etching through a chemical reaction using a solution. In an example, a depth to which the insulating layer is removed may be less than or equal to the depth of the first upper electrode 145. An empty space 415 may be formed by removing the sidewall insulating layer 410 in an area adjacent to the first upper electrode 145, and the second upper electrodes 150 may be formed in the empty space 415 during a later operation.

As a result of removing the sidewall insulating layer 410 on the upper portion of the gate trench 130, a portion of the side surface of the first upper electrode 145 is exposed, and the remaining portion of the side surface of the first upper electrode is surrounded by the sidewall insulating layer 410.

A length "d" of the exposed portion of the first upper electrode 145 may be greater than a length of the unexposed portion of the first upper electrode 145. The length "d" of the exposed portion of the first upper electrode 145 may be at least twice greater than the length of the unexposed portion of the first upper electrode 145. In order not to collapse the first upper electrode, the remaining portion of the side surface of the first upper electrode 145 is surrounded by the sidewall insulation layer 410. When the entire side surface of the first upper electrode 145 is exposed, the first upper electrode pattern may be collapsed down.

Figure 4G:
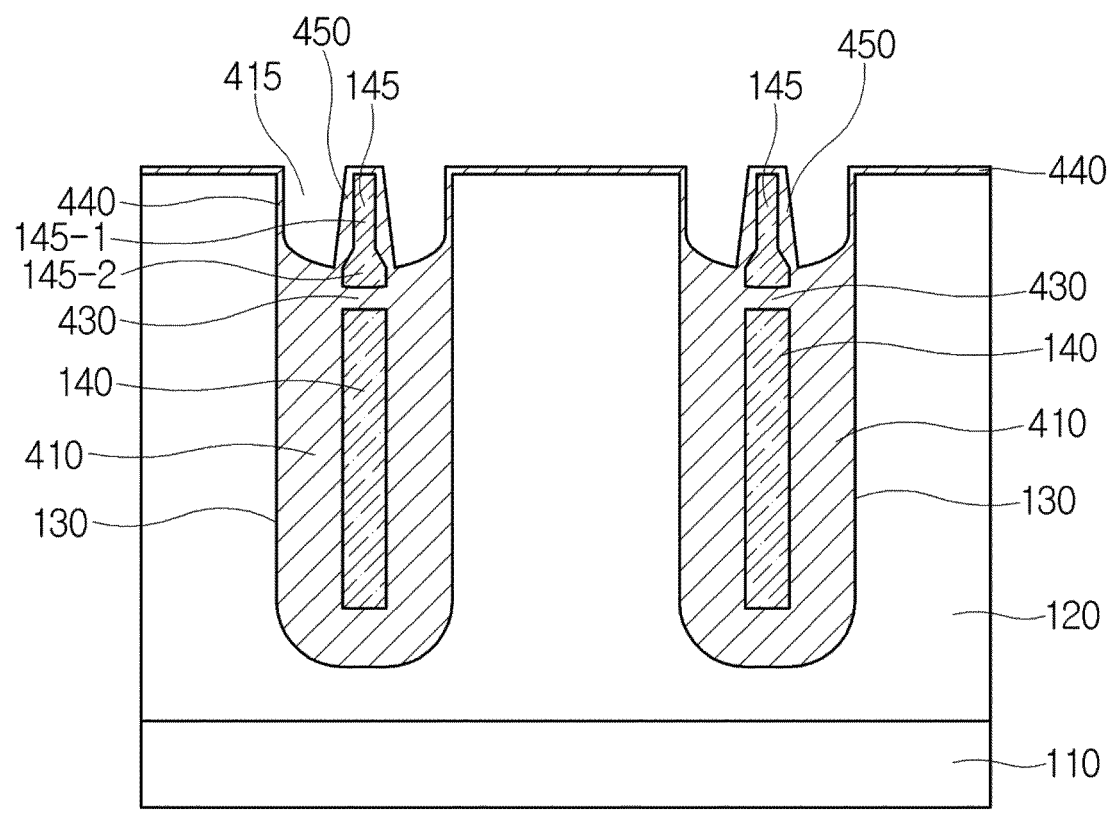

Referring to FIGS. 3 and 4G, an operation 340 forms the gate insulating layer 440 on the sidewall of the gate trench 130.

The thin gate insulating layer 440 can be formed by thermally oxidizing the exposed side surface of the first upper electrode 145. As a result of operation 340, as illustrated in FIG. 4G, the gate insulating layer 440 may be formed on the sidewall of the gate trench 130.

Additionally, the thick second inter-electrode insulating layer 450 may be formed on the exposed surface of the first upper electrode 145. The gate insulating layer 440 and the second inter-electrode insulating layer 450 may be formed simultaneously in the same operation. In the example of the first upper electrode 145, the portion of the first upper electrode 145 originally surrounded by the sidewall insulating layer 410 may not be oxidized. However, the portion of the first upper electrode 145 that is not surrounded by the sidewall insulating layer 410 is thermally oxidized, so that the second inter-electrode insulating layer 450 is formed on the side surface and the top surface of the first upper electrode 145. The exposed surface of the first upper electrode 145 is thermally oxidized to form the second inter-electrode insulating layer 450. The surface of the first region 145-1 of the first upper electrode 145 is oxidized. On the other hand, the second region 145-2 of the first upper electrode 145 remains as it is. Thus, the thickness or width of the upper portion of the first upper electrode 145 is reduced overall.

In an example, if the first upper electrode 145 is divided into the first region 145-1 that is an upper region thereof and the second region 145-2 that is a lower region thereof, the second region 145-2 is formed under the first region 145-1. Additionally, the second region 145-2 may be formed closer to the lower electrode 140 than the first region 145-1. The second region 145-2 may be formed to have a width that is larger than a width of the first region 145-1. The first region 145-1 may be a region in which the surface of the first upper electrode 145 has been oxidized, while the second region 145-2 may be a region in which the surface of the first upper electrode 145 is not oxidized. Therefore, while the width of the second region 145-2 is maintained, the width of first region 145-1 is reduced by the surface oxidation. The width of the second region 145-2 of the first upper electrode 145 may be similar to the width of the lower electrode 140. On the other hand, the width of the first region 145-1 of the first upper electrode 145 may be less than the width of the lower electrode 140.

Figure 4H:
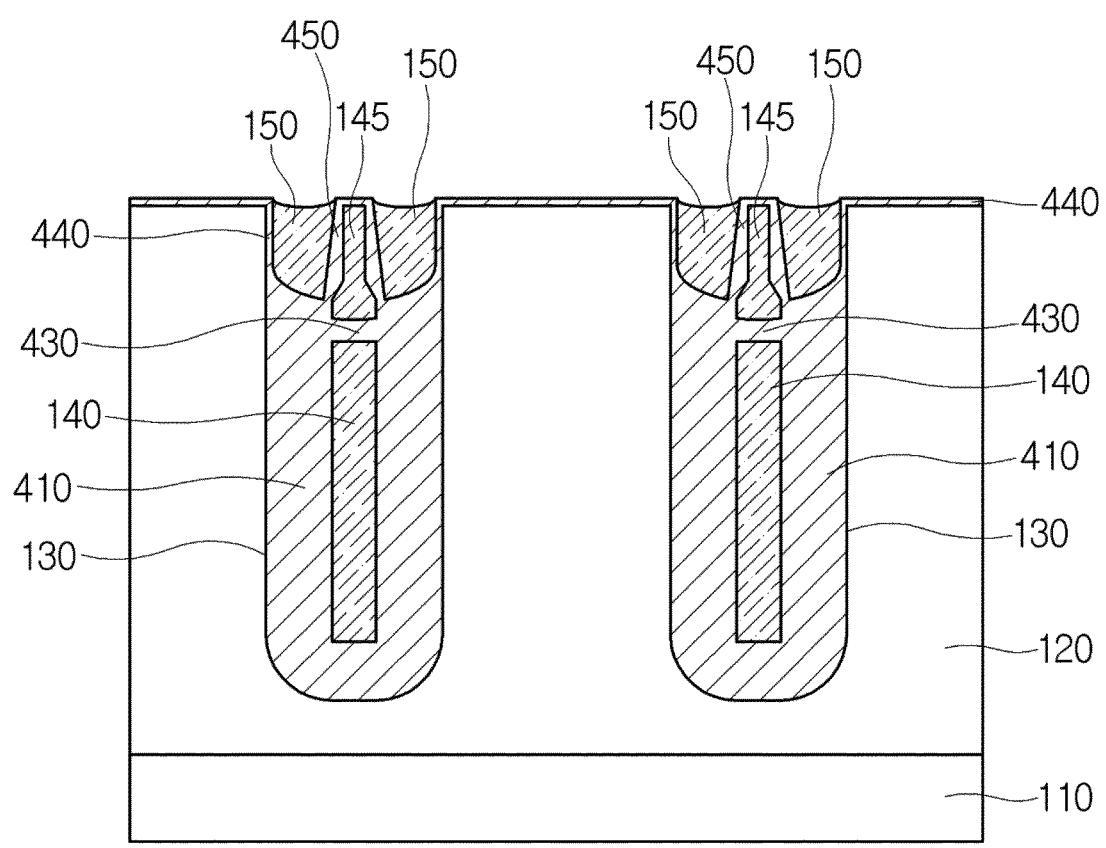

Referring to FIGS. 3 and 4H, an operation 345 deposits a third conductive layer on the gate insulating layer 440 and etches the third conductive layer, so that the second upper electrodes 150 are formed in parallel with the side of the first upper electrode 145.

In order to form the second upper electrodes 150, the third conductive layer (not shown) is deposited on the gate insulating layer 440 and the second inter-electrode insulating layer 450. Doped polysilicon or metal layer can be deposited on the third conductive layer.

An empty space 415 (see FIG. 4G) may be formed in a region adjacent to the first upper electrode 145 within the gate trench 130 by the above operations. The empty space 415 is filled by the third polysilicon and then, performing an etch-back process. The second upper electrodes 150 may be formed on the gate insulating layer 440 and the second inter-electrode insulating layer 450. The etch-back process can be replaced by chemical-mechanical processing (CMP). In an example, the second upper electrodes 150 and the first upper electrode 145 may be insulated from each other by the second inter-electrode insulating layer 450 formed in operation 340.

Regarding the structural characteristics of the first upper electrode 145 and the second upper electrodes 150, the width of the first upper electrode 145 may be less than the width of each of the second upper electrodes 150. On the basis of the surface of the substrate, the depth of the first upper electrode 145 may be greater than the depth of the second upper electrodes 150. The second upper electrodes 150 may be formed adjacent to the side surface of the first upper electrodes 150, and may surround the first upper electrode 145. The first upper electrode 145 may be electrically connected to the second upper electrodes 150 and can be used as a gate electrode. The cross-sectional area of the second upper electrodes 150 may be formed to be larger than the cross-sectional area of the first upper electrode 145.

The formation of a gate module having the split gate structure within the gate trench 130 can be completed by the above-described operations. Then, an operation of connecting the source metal may additionally be carried out.

Figure 4I:
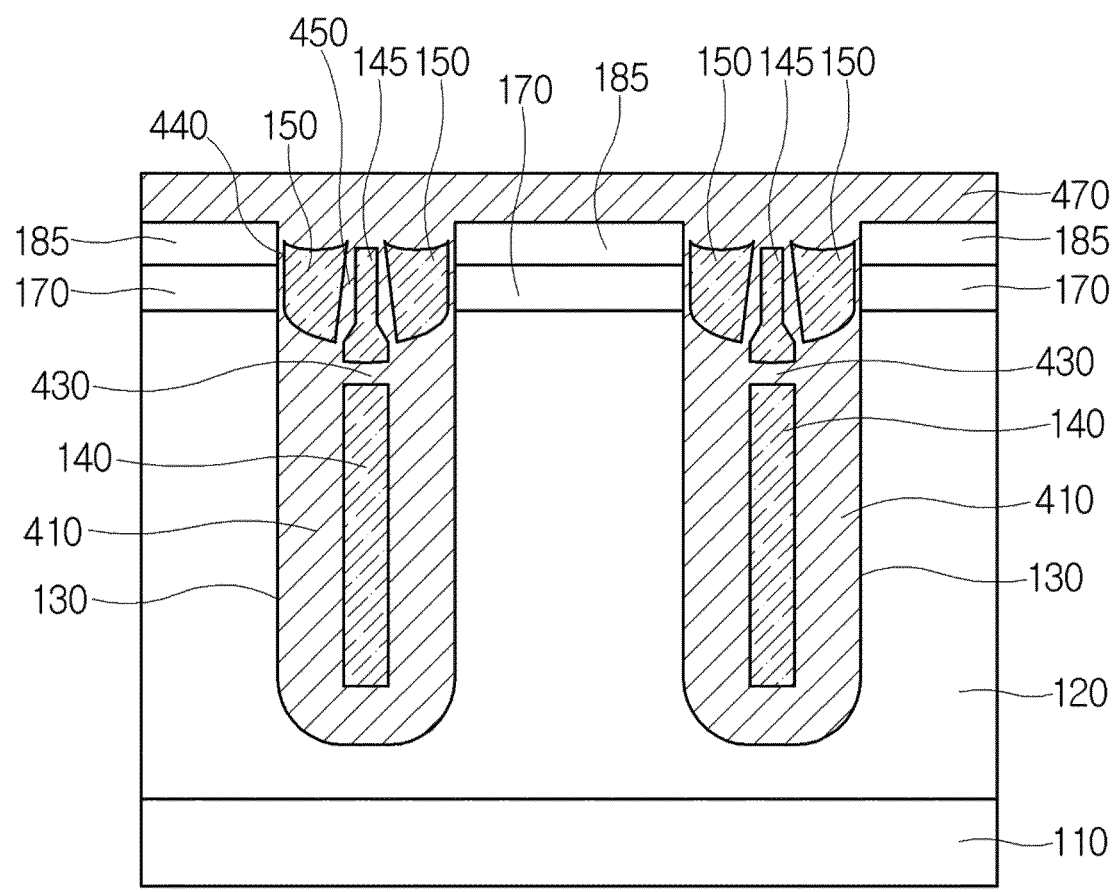

Referring to FIGS. 3 and 4I, an operation 350 forms the body region, the source region, and the interlayer insulating layer on the substrate.

First, before forming the interlayer insulating layer, the P-type body region 170 and the high concentration N-type source region 185 may be formed between the gate trench 130 in which the gate module has been formed. For this purpose, the P-type body region 170 may be formed deep by implanting a P-type dopant into the substrate. Then, the high concentration N-type source region 185 may be formed by implanting an N-type dopant into the P-type body region 170. Then, the interlayer insulating layer 470 may be formed over the entire top surface. The interlayer insulating layer 470 may be implemented for subsequent isolation between the gate module and the source metal. The interlayer insulating layer 470 may be formed on the respective first and second upper electrodes 145 and 150. The source metal 190 and the first and second upper electrodes 145 and 150 may be electrically isolated by the interlayer insulating layer 470.

Figure 4J:
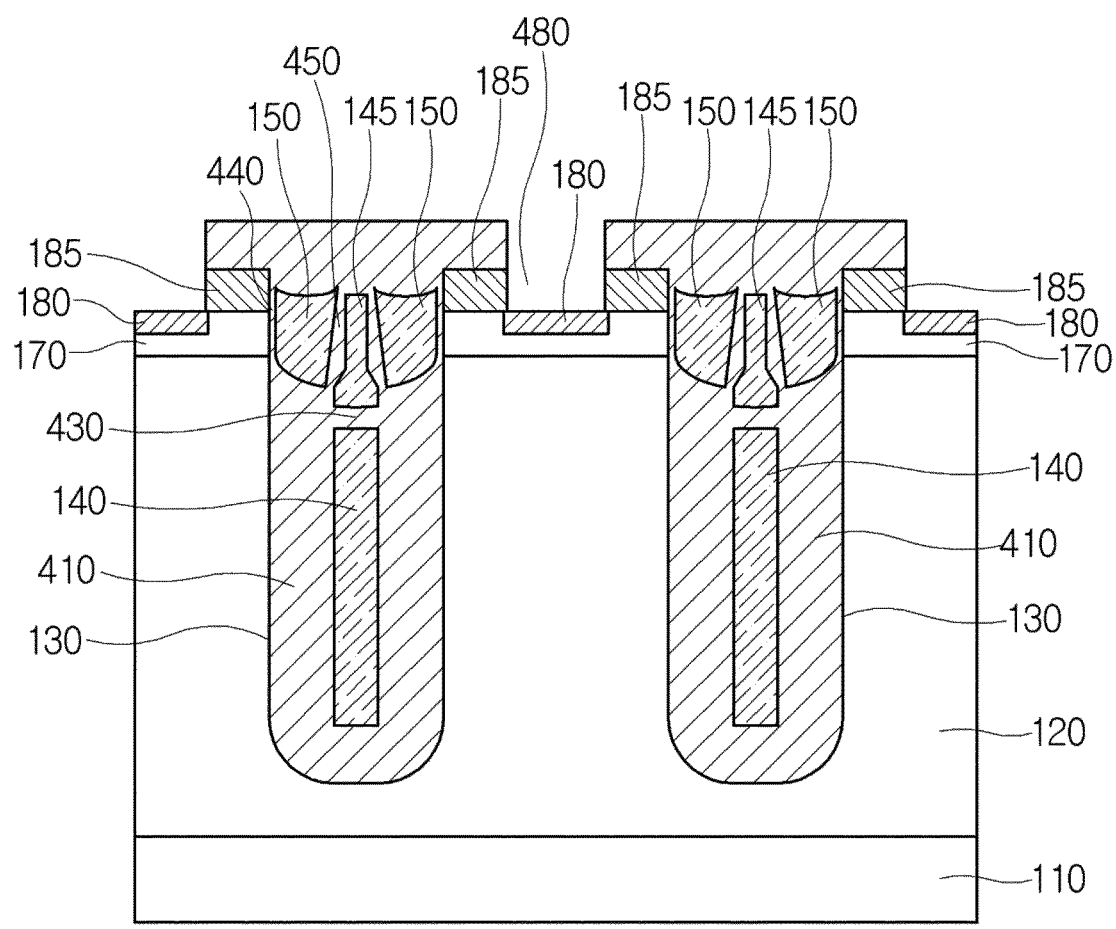

Referring to FIGS. 3 and 4J, an operation 355 etches the interlayer insulating layer 470 to form a contact hole 480.

A contact hole 480, which reaches the P-type body region 170, may be formed by etching the interlayer insulating layer 470 and the high concentration N-type source region 185. Further, the high concentration P-type region 180 which has a higher concentration than a concentration of the p-type body region 170, may be formed at the end of the contact hole 480. The high concentration P-type region 180 may become the body contact region. As a result of operation 355, the high concentration P-type region 180 may be formed in a portion of the P-type body region 170, which is in contact with the contact hole. Additionally, the high concentration N-type source region 185 may be cut by the contact hole, so that only the tops of both end surfaces of the P-type body region 170 remain, and as a result, a pair of high concentration N-type source regions 185 can be formed. On the basis of the surface of the substrate, a position of the high concentration N-type source region 185 may be higher than a position of the high concentration P-type region 180.

Figure 4K:
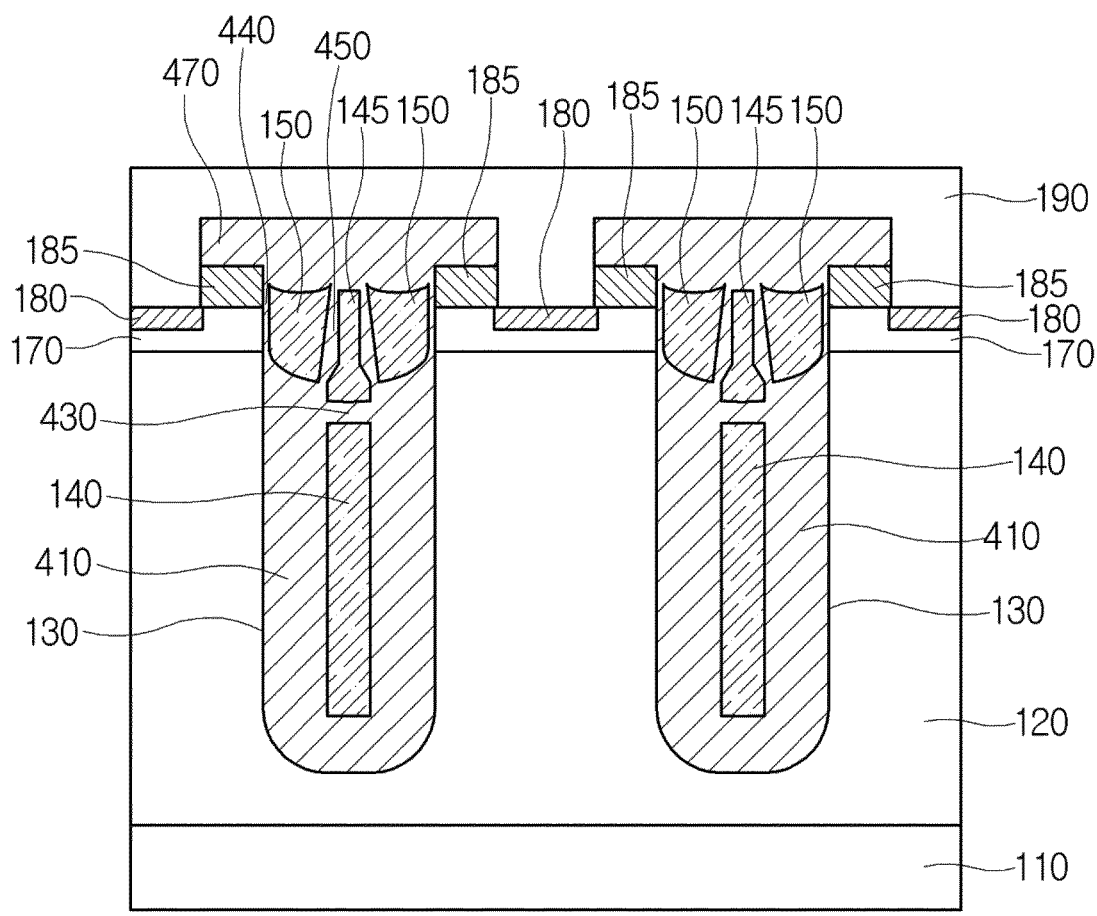

Referring to FIGS. 3 and 4K, an operation 360 forms the source metal 190 on the interlayer insulating layer 470.

The source metal 190 may be formed on the interlayer insulating layer 470 and within the contact hole 480 by depositing a metallic material. The metallic material may include, but is not limited to, Al, W, Cu or the like. The source metal 190 may be in contact with the high concentration P-type region 180 and the high concentration N-type source region 185 through the contact hole. The source metal 190 may be electrically connected to the source electrode 140. Additionally, the source metal 190 may be in direct physical contact with the P-type body region 170, the body contact region 180, and the high concentration N-type source region 185. On the other hand, drain metal (not shown) may be formed on the bottom surface of the substrate. Thus, a current path may be formed in a vertical direction. When electrons are supplied through the source metal 170, the electrons can pass through the N-type source region 185 and the P-type body region 170, pass through the drift region 120, and move to the drain metal through the drain region 110.

The foregoing description can be summarized as follows. Additionally, it will be understood by those skilled in the art that various changes and modifications of the following description can be made therein without departing from the spirit and scope of the examples.

According to various examples, the trench MOSFET manufacturing method includes forming a gate trench in a substrate, forming a sidewall insulating layer within the gate trench, forming a source electrode in a lower portion of the gate trench by depositing a first conductive layer on the sidewall insulating layer and etching, forming a first inter-electrode insulating layer over the source electrode, forming a first upper electrode by depositing a second conductive layer on the first inter-electrode insulating layer and etching, removing the sidewall insulating layer so as to expose a sidewall of the gate trench, forming a gate insulating layer between the sidewall of the gate trench and the first upper electrode, and forming, by depositing a third conductive layer on the gate insulating layer and etching, a second upper electrode which is formed in parallel to a side of the first upper electrode.

According to various examples, the method may further include forming a body region on the substrate and forming a source region on the body region, forming an interlayer insulating layer on the source region and on the gate trench, and forming source metal on the interlayer insulating layer.

According to various examples, the removing of the sidewall insulating layer so as to expose the sidewall of the gate trench includes removing the sidewall insulating layer such that a portion of the sidewall of the gate trench and a portion of a side of the first upper electrode are exposed and the remaining side of the first upper electrode is surrounded by the sidewall insulating layer.

According to various examples, a width of the first upper electrode is less than a width of the second upper electrode, and a depth of the first upper electrode from a surface of the substrate is greater than a depth of the second upper electrode from the surface of the substrate.

According to various examples, the first upper electrode includes a first region and a second region. The first region is formed to overlap the second upper electrode in a horizontal direction. The second region is formed under the first region and is formed closer to the source electrode than the first region. A width of the second region is greater than a width of the first region.

According to various examples, the method may further include forming a second inter-electrode insulating layer on a surface of the first upper electrode. A thickness of the second inter-electrode insulating layer is larger than a thickness of the gate insulating layer.

According to various examples, the trench MOSFET may include a substrate, a gate trench formed on the substrate, a sidewall insulating layer formed on a sidewall of the gate trench, a source electrode which is surrounded by the sidewall insulating layer, a first upper electrode which is provided above the source electrode, a first inter-electrode insulating layer which is formed between the source electrode and the first upper electrode, a second upper electrode which is formed adjacent to a side of the first upper electrode and surrounds the first upper electrode, and an interlayer insulating layer which is formed on the first upper electrode and the second upper electrode.

According to various examples, the trench MOSFET may further include a body region which is formed on the substrate, a high concentration source region and a high concentration contact region which are formed in the body region, and a source metal which is provided on the interlayer insulating layer and is in contact with the body region.

According to various examples, the first upper electrode is electrically connected to the second upper electrode and is used as a gate electrode.

According to various examples, the trench MOSFET may further include a gate insulating layer formed on an upper sidewall of the gate trench. The sidewall insulating layer, the first inter-electrode insulating layer, the gate insulating layer, and the interlayer insulating layer are connected to each other.

According to various examples, a width of the first upper electrode is less than a width of the second upper electrode and a depth of the first upper electrode from a surface of the substrate is greater than a depth of the second upper electrode from the surface of the substrate.

According to various examples, the first upper electrode includes a first region and a second region. The first region is formed to overlap the second upper electrode in a horizontal direction. The second region is formed under the first region and is formed closer to a lower electrode than the first region. A width of the second region is greater than a width of the first region.

According to various examples, the trench MOSFET may include a substrate; a body region which is formed on the substrate; a source region in the body region; a gate trench formed on the substrate; one lower electrode formed in a lower portion of the gate trench; a plurality of upper electrodes formed above the one lower electrode. The plurality of upper electrodes includes: a first upper electrode which is formed to overlap the lower electrode; and a second upper electrode which surrounds the first upper electrode, a first inter-electrode insulating layer which is formed between the lower electrode and the first upper electrode; a gate insulating layer formed on a sidewall of the gate trench; an interlayer insulating layer formed on the plurality of upper electrodes; and a source metal which is provided on the interlayer insulating layer and is in contact with the body region.

According to various examples, the first upper electrode and the second upper electrode may be implemented as a gate electrode.

According to various examples, a cross-sectional area of the second upper electrode is greater than a cross-sectional area of the first upper electrode.

According to various examples, the trench MOSFET may further include a sidewall insulating layer which surrounds the lower electrode. A width of the sidewall insulating layer is larger than a width of a source electrode.

According to various examples, a depth of the first upper electrode from a surface of the substrate is greater than a depth of the body region from the surface of the substrate.

According to various examples, the trench MOSFET may further include a second inter-electrode insulating layer formed between the first upper electrode and the second upper electrode. A thickness of the second inter-electrode insulating layer is larger than a thickness of the gate insulating layer.

According to various examples, the first upper electrode includes a first region and a second region. The first region is formed to overlap the second upper electrode in a horizontal direction. The second region is formed under the first region and is formed closer to the lower electrode than the first region. A width of the first region of the first upper electrode is less than a width of the lower electrode.

As described above, the example structure may be formed by implementing operations 325 and 330 as illustrated in FIG. 3 in the compared manufacturing process. Accordingly, the example structure simplifies the manufacturing process, and reduces the capacitance formed between the gate electrode and the source electrode than typical structures.

What is claimed is:

1. A method of manufacturing trench metal-oxide semiconductor field-effect transistor (MOSFET), the method comprising:
    forming a gate trench in a substrate;
    forming a sidewall insulating layer within the gate trench;
    forming a lower electrode in a lower region of the gate trench;
    forming a first insulating layer over the lower electrode;
    forming a first upper electrode on the first insulating layer;
    removing an upper portion of the sidewall insulating layer to expose an upper portion of the gate trench;
    forming a gate insulating layer on a sidewall of the upper portion of the gate trench;
    forming second upper electrodes to surround the first upper electrode;
    forming a body region, adjacent to the gate trench, in the substrate;
    forming a source region in the body region;
    forming an interlayer insulating layer on the body region and the source region; and
    forming a source metal on the interlayer insulating layer.

2. The method of claim 1,
    wherein a depth of the first upper electrode from a surface of the substrate is greater than a depth of each of the second upper electrodes from the surface of the substrate.

3. The method of claim 1,
    wherein the first upper electrode comprises a first region and a second region, and
    wherein a width of the first region is less than a width of the second region.

4. The method of claim 3,
    wherein a width of the second region of the first upper electrode is equal to a width of the lower electrode.

5. A method of manufacturing trench metal-oxide semiconductor field-effect transistor (MOSFET), the method comprising:
forming a gate trench in a substrate;
forming a lower electrode in a lower region of the gate trench; and
forming a plurality of gate electrodes in an upper region of the gate trench,
wherein the plurality of gate electrodes comprises:
a first upper electrode disposed above the lower electrode, and
second upper electrodes disposed at opposite sides of the upper region of the gate trench, and surrounding the first upper electrode, and
wherein the first upper electrode comprises a first region and a second region, and a width of the first region is less than a width of the second region.

6. The method of claim 5, wherein the forming of the plurality of gate electrodes comprises:
forming the first upper electrode on the lower electrode; and
forming the second upper electrodes to surround the first upper electrode.

7. The method of claim 5, wherein
the first upper electrode is spaced apart from the lower electrode, and
a first insulating layer is formed between the lower electrode and the first upper electrode.

8. The method of claim 5,
wherein the width of the first region is less than a width of the lower electrode, and the width of the second region is equal to the width of the lower electrode.

9. The method of claim 5,
wherein a width of the first upper electrode is less than a width of each of the second upper electrodes, and
wherein a depth of the first upper electrode from a surface of the substrate is greater than a depth of each of the second upper electrodes from the surface of the substrate.

10. The method of claim 5, wherein a cross-sectional area of each of the second upper electrodes is greater than a cross-sectional area of the first upper electrode.

11. The method of claim 7, further comprising:
forming a sidewall insulating layer within the gate trench;
removing an upper portion of the sidewall insulating layer to expose an upper portion of the gate trench; and
forming a gate insulating layer on a sidewall of the upper portion of the gate trench.

12. A method of manufacturing trench metal-oxide semiconductor field-effect transistor (MOSFET), the method comprising:
forming a gate trench in a substrate;
forming a lower electrode in a lower region of the gate trench;
forming a plurality of gate electrodes above the lower electrode, the plurality of gate electrodes comprising:
a first upper electrode, formed to overlap the lower electrode; and
second upper electrodes, configured to surround the first upper electrode;
forming a body region, adjacent to the gate trench, in the substrate;
forming a source region disposed in the body region;
forming an interlayer insulating layer on the body region and the source region; and
forming a source metal on the interlayer insulating layer,
wherein the first upper electro de comprises a first region and a second region, and
wherein a width of the second region is greater than a width of the first region.

13. The method of claim 12, wherein the forming of the plurality of gate electrodes comprises:
forming the first upper electrode on the lower electrode; and
forming the second upper electrodes to surround the first upper electrode.

14. The method of claim 12,
wherein a depth of the first upper electrode from a surface of the substrate is greater than a depth of each of the second upper electrodes from the surface of the substrate.

15. The method of claim 12,
wherein the width of the first region is less than a width of the lower electrode, and the width of the second region is equal to the width of the lower electrode.

16. The method of claim 12, wherein
the first upper electrode is spaced apart from the lower electrode, and
an electrode insulating layer is formed between the first upper electrode and the lower electrode.

17. The method of claim 12, further comprising:
forming a sidewall insulating layer within the gate trench;
removing an upper portion of the sidewall insulating layer to expose an upper portion of the gate trench; and
forming a gate insulating layer on a sidewall of the upper portion of the gate trench.

18. The method of claim 12, wherein a cross-sectional area of each of the second upper electrodes is greater than a cross-sectional area of the first upper electrode.

* * * * *